(12) United States Patent
Hansen et al.

(10) Patent No.: US 6,794,654 B1
(45) Date of Patent: Sep. 21, 2004

(54) DETECTOR MODULE FOR AN X-RAY DETECTOR SYSTEM

(75) Inventors: Karsten Hansen, Hamburg (DE); Larc Troger, Hamburg (DE)

(73) Assignee: Deutsches Elektronen-Synchrotron DESY, Hamburg (DE)

( * ) Notice: Subject to any disclaimer, the term of this patent is extended or adjusted under 35 U.S.C. 154(b) by 111 days.

(21) Appl. No.: 10/018,489

(22) PCT Filed: Jun. 21, 2000

(86) PCT No.: PCT/EP00/05758

§ 371 (c)(1),
(2), (4) Date: Apr. 8, 2002

(87) PCT Pub. No.: WO00/79598

PCT Pub. Date: Dec. 28, 2000

(30) Foreign Application Priority Data

Jun. 21, 1999 (DE) .......................... 199 29 567

(51) Int. Cl.[7] .............................................. G01T 1/24
(52) U.S. Cl. .................... 250/370.09; 250/366
(58) Field of Search ................... 250/370.09, 370.11, 250/370.13, 370.14, 366, 367, 368, 363.01, 363.02, 363.08, 363.1

(56) References Cited

U.S. PATENT DOCUMENTS

| | | | |
|---|---|---|---|
| 4,700,076 A | * | 10/1987 | Dorman et al. ........ 250/370.09 |
| 5,041,729 A | | 8/1991 | Takahashi et al. |
| 5,191,202 A | * | 3/1993 | Kitamura et al. ........ 250/208.1 |
| 5,464,984 A | | 11/1995 | Cox et al. |
| 5,777,335 A | | 7/1998 | Iakami |
| 6,091,071 A | * | 7/2000 | Franz et al. ................. 250/372 |
| 6,455,858 B1 | * | 9/2002 | Patt et al. .............. 250/370.14 |
| 6,500,694 B1 | * | 12/2002 | Enquist ...................... 438/109 |
| 6,510,195 B1 | * | 1/2003 | Chappo et al. ................ 378/19 |
| 6,515,285 B1 | * | 2/2003 | Marshall et al. ............ 250/352 |
| 6,521,894 B1 | * | 2/2003 | Iwanczyk et al. ...... 250/370.11 |

* cited by examiner

Primary Examiner—Constantine Hannaher
Assistant Examiner—Otilia Gabor
(74) Attorney, Agent, or Firm—Nixon & Vanderhye PC (57) ABSTRACT

A detector module for measuring radiation in an X-ray detector system includes a plurality of modules each having a detector array. Each array includes a plurality of detector elements on a first surface facing a radiation source and a conductor track carrier provided with conducter tracks and spaced from another surface of the array. Bores extend through the conductor track carrier for the detector elements and bonding wires interconnect first connections on the detector elements and the conductor tracks. The conductor tracks extend to signal processing electronics to process signals from individual detector elements.

30 Claims, 5 Drawing Sheets

DETECTOR MODULE FOR AN X-RAY DETECTOR SYSTEM

The invention relates in general to a detector module for an X-ray detector system for use in X-ray holography and X-ray spectroscopy with atomic resolution as well as a modular X-ray detector system for the above applications in which such detector modules are used.

Since the invention of holography in 1948, work has been carried out on the application of the holography principle to the three-dimensional representation of atomic structures. A possible solution principle is based on the technique of X-ray holography.

In X-ray holography, atoms in a material sample to be examined are excited to fluorescence, and the fluorescence radiation from the material sample is recorded by a detector. The electric output signals of the detector, which reflect the interference field which builds up within the material sample, then give information about the three-dimensional structure of the examined sample material. For this purpose it is however necessary that the highest possible number of measurements be carried out on the material sample.

In the past few years, clear progress has been made in the development and production of X-ray detectors which are intended to record the fluorescence radiation of the material sample and separate this reliably from the varied background radiation. These detectors must on the one hand be energy-sensitive, in order to make possible a distinction of the incoming photons according to their energy or the wavelength of the radiation, but on the other hand, make it possible to operate up to such high counting rates that they record some hundreds of thousands of photons per second. For this purpose, in addition to silicon detectors, mostly germanium detectors were used in the past. The latter must however be cooled with liquid nitrogen, which is relatively costly, and are more suited to recording radiation from approximately 10 keV. A further disadvantage in the use of germanium detectors is that the electronics needed to amplify the measurement signals from the germanium detector can only be arranged at a position which is relatively remote from the germanium detector. To couple the germanium detector with the amplification electronics, long connection lines are thus required, which leads to strong interference and to a susceptibility to error. An integration of pre-amplifier stages in the vicinity of the germanium detector has to date not been successful, the costly cooling of the germanium detector representing a major obstacle. In addition, with an integration of the amplification electronics in the vicinity of the germanium detectors, a considerable number of signal lines must be routed away from the germanium detector or from the amplification electronics, which has proved to be an insurmountable obstacle even with smaller detector lines or detector arrays.

Very recently, progress has also been made in the development and production of location- and energy-resolving silicon X-ray detectors. Thus for example, the monolithic integration of highly sensitive drift detector cells with field effect transistors based on high-resistance silicon substrates was achieved. This detector type has already been used as a single-cell detector in the field of X-ray holography.

As mentioned above, it is necessary for X-ray holography that as large as possible a number of measurements of the material sample be carried out. In one of the possible concrete measurement processes (measurement process 1), this means that a large number of measurements of the fluorescence radiation of the sample are carried out above the material sample over the solid angle region of a hemisphere above the material sample with an angular resolution in the degree range. With these measurements, it is necessary when using single-cell detectors to displace the detector, by means of a mechanically complex and costly displacement structure, stepwise along various tracks on the semi-spherical surface above the material sample. To be able to detect the characteristic lines within the spectrum with the required accuracy, approximately $2 \cdot 10^6$ entries per solid angle element are for example required. Up to an event rate of approximately 150 kHz, the lines can be determined without major adverse effect on their width. As, for example, 7200 recordings at different solid angles may be required for a complete hologram, a total measurement time of some 24 hours results.

In a second concrete measurement process (measurement process 2) of X-ray holography, the required angular resolution is achieved through different arrival angles of monochromatic X-ray light. An angular resolution of the fluorescence radiation of the sample and thus a displacement of the detector is not required. Due to the abovementioned event-rate limitation of single-cell detectors, the same total measurement time results.

It is possible to shorten the long total measurement time by using multi-cell detectors instead of a single-cell detector. Through simultaneous measurement of different angle regions (measurement process 1) or the event rate correspondingly multiplied in the case of multi-cell detectors, (measurement process 2), the total measurement time is reduced by approximately the factor of the number of detector elements. Due to the limited number of cells or elements, all commercial multi-cell germanium detectors neither make costly displacement structures superfluous in measurement process 1 nor make possible a measurement time reduction to less than approximately one hour (both measurement processes). This reduction in measurement time is regarded as insufficient, as both (synchrotron) radiation sources and the detectors are subjected to fluctuations during long-time operation. The material sample itself can also change during this long measurement, for which reason real-time recordings are ideally desired.

In addition to the detailed example of X-ray holography presented here, detectors for X-ray radiation are used in many other measurement methods, for example in X-ray absorption spectroscopy, X-ray diffraction, X-ray fluorescence analysis and many more fields. For reasons comparable with those mentioned above, commercial silicon and germanium detectors limit the measurements in many applications (for example in synchrotron radiation sources) due to the maximum possible event rate of the detectors or the achievable angle or location resolution.

In U.S. Pat. No. 5,041,729, a multi-cell radiation detector is disclosed in which a number of detector elements is arranged in the form of a line. The radiation detector contains a scintillator on the rear side of which 12 lamellar photodiodes are arranged in the form of a line alongside each other. A holder is attached to the photodiodes by means of an isolating adhesive so that all 12 photodiodes are covered and an end section of each photodiode is exposed for wiring. The holder consists of a ceramic insulator and is equipped on its rear side with signal lines for each element. The bond-connection surface of each photodiode is connected by a wire bond to the signal lines. The disadvantage of this design is that only a detector line—but not a detector array—can be produced as the type of wiring allows exclusively a linear arrangement of the detector elements. When using a detector line however, a very long measurement time is required. In addition, the detector line must be displaced stepwise by means of a mechanically complex and costly displacement structure to carry out a complete recording.

It is therefore the object of the invention to provide a detector system with the help of which the above-mentioned disadvantages of the state of the art are overcome. It is in particular the object of the present invention to provide a detector module with a two-dimensional arrangement of detector elements forming a detector array including the corresponding wiring technique, the simultaneous recording of X-ray light being possible via a location or angular resolution, so that for example in X-ray holography, the otherwise customary displacement structure is superfluous. A further object of the invention is to make possible a high total event rate of the detector system so that the measurement time is clearly reduced for the same quality of the measurement results, or the quality of the measurement results is increased for the same measurement time.

A detector module with the features of patent claim 1 serves to achieve these objects, and also a detector system constructed from such detector modules with the features of patent claim 29. Advantageous versions of the detector module and of the detector system are the subject of the associated dependent claims.

The basic idea of the present invention is to arrange several detector modules, each containing a number of detector elements, around the material sample to be examined, roughly in the form of a hemisphere. On the basis of such a detector arrangement, significantly shorter measurement times and even the generation of real-time images is possible.

This arrangement of detector elements leads, however, due to the high necessary density of the detector elements, to subsequent problems with regard to the contact between the detector elements and the cooling of the detector modules or of the associated signal-processing electronics. In the case of the detector module according to the invention, detector cells are used which are provided with integrated pre-amplifier electronics on the silicon substrate. As a result, although the length of the signal line tracks between the detector element and the pre-amplifier step is reduced, which leads to a marked reduction in interference, the number of signal lines which must be routed away from the detector element/pre-amplifier arrangement is simultaneously increased.

The arrangement of the detector modules is preferably based on the capped icosahedron structure of $C_{60}$ fullerene (buckyball), in which (as with a football) an internal basic framework in the form of a hemisphere is formed by ten hexagonal detector modules, the five pentagonal holes of which between the hexagonal detector modules are filled by five further detector modules. Either pentagonal detector modules can be inserted into the pentagonal holes or, which is preferable on cost grounds, the pentagonal holes covered by identical hexagonal detector modules.

In a preferred design, the radius of the hemisphere is approx. 3.7 cm. With this design, approx. 900 individual detector elements are provided in total, as a result of which a solid-angle resolution of approx. 4° is achieved. With the capped icosahedron structure, 15 detector modules are required in total, each detector module bearing approx. 60 detector elements. As detector type, silicon detectors are used with which, in contrast to the known germanium detectors, operation is possible at room temperature. Silicon detectors are superior to germanium detectors at low and average energy levels and high counting rates in the resolution. However, each silicon detector element has a power consumption (determined by the transistor integrated therein) of up to approx. 4 mW, so that a power density of up to approx. 80 mW/cm$^2$ results therefrom. It is clear from this that, despite the use of silicon detectors measures to cool the detector elements or the detector modules are required (conventional air, water or Peltier cooling).

As explained above, each detector module preferably contains approximately 60 detector elements which form a detector array in areal, side-by-side arrangement, which essentially has the same hexagonal basic shape as the actual detector module. Due to the necessary low-parasitism coupling of the signal-processing electronics for the processing of the analog signals coming from the individual detector elements (highly sensitive drift detector cells which are monolithically integrated with field effect transistors), these signal-processing electronics must be integrated in the vicinity of the detector elements or of the detector array. Because of the lower self-heating of the individual detector elements and the clearly higher loss consumption of the components of the signal-processing electronics, a thermal decoupling between the signal-processing electronics and the detector array and also a cooling or a good heat dissipation of corresponding heat flows is necessary. A good heat dissipation is achieved by arranging for housing parts of the module body to consist of a material with good heat-conducting properties, preferably graphite. A thermal decoupling of both heat sources is achieved by arranging for heat flows of the two heat sources to take the shortest possible common tracks. The selection of suitable materials and cross-sections between heat sources and heat sink is based on the respective quantities of the heat flows.

The local integration or low parasitism coupling of the signal-processing electronics to the detector array preferably takes place with the help of a conductor track carrier which is arranged directly above the detector array. On this conductor track carrier there would theoretically have to be provided a conductor track for each connection of each detector element, each conductor track having a first end contact in the immediate vicinity of the respective detector connection, in order to be connected to same by a bonding wire, and a second end contact which is located at one end edge of the conductor track carrier, in order to be connected from there to the electronics.

Upon the electric contact between the individual silicon detector elements, in the development presented here with integrated field effect transistor, contact between a total of 6 connections would be necessary for each detector element, and connection with very short bonding wire lengths to the conductor track carrier arranged above the detector elements. In the case of a sensitive surface of approximately 5 mm$^2$ for each detector element, a contact with a conventional bonding wire technique is not possible. In addition, the conductor tracks lying tightly alongside another would mutually influence one another, which would lead to a marked impairment of the measurement results. This problem is solved according to the invention in that some connections of the detector elements, preferably the sensitive signal conductor connections, are preferably each connected together with a constant-voltage-carrying connection by bonding wires to the conductor track carrier or to the respective first end contacts of the conductor tracks provided on the conductor track carrier. The remaining connections of the detector elements are connected with the help of simple chain bond connections to an external bus structure running in annular fashion around the external edges of the detector array, and via bonding wires through additional bores in the edge area of the conductor track carrier to conductor tracks provided on the conductor track carrier. The number of bond connections which must be guided through bores in the conductor track carrier, and also the number of conductor tracks is clearly reduced as a result. To reduce the undesired reciprocal coupling of the conductor tracks arranged side-by-side on the conductor track carrier, the conductor tracks which are connected to the above constant-voltage-carrying connections are each guided on the conductor track carrier between two signal conductor tracks running side-by-side.

The coupling between signal lines is determined essentially by the dielectric constant of the carrier material. Ceramic materials such as $Al_2O_3$ or else AlN have a dielectric constant higher by roughly a factor of 3 than for example polymers. Therefore, an intermediate layer with a clearly smaller dielectric constant is preferably embedded between the mechanically stable carrier material with a higher dielectric constant and the signal-carrying metallization plane. The thickness of this intermediate layer should correspond approximately to the width of a signal-carrying conductor track. As material for the intermediate layer, there can be used in particular benzocyclobutenes or also polyphenylquinoxalines with a relative dielectric constant of approx. 2.7, but also standard polyimides would be conceivable. A further optimization is achieved by providing the screening conductor tracks located in the metallization plane (detailled description follows) at the same point also in a second metallization plane between the rigid support and the dielectric intermediate layer. Compared with the simplest solution, in which the signal lines are developed directly on a ceramic support, the coupling capacity can be reduced by more than a factor of 30, precisely when there are small gaps between the signal lines (for example approx. 50 $\mu$m for conductor track widths of approx. 15 $\mu$m).

As mentioned at the outset, the basic idea of the present invention is to arrange several detector arrays or detector modules, each containing a number of detector elements, around the material sample to be examined, roughly in the form of a hemisphere. The hemisphere surface is preferably constructed by an arrangement of several areal detector modules each of which contains several detector elements. The individual detector modules are preferably shaped and arranged such that as complete a coverage of the hemisphere surface as possible is achieved. The use of as few different module forms as possible is preferred. A possible variant is to combine four hexagons and five squares into a tetrakaidecahedron. A further preferred variant is to use a capped icosahedron structure of $C_{60}$ fullerene (buckyball) in which an approximately hemispherical surface is formed from ten hexagons, the five pentagonal free surfaces of which are either closed by suitably inserted pentagons or covered by identical hexagons. With both variants named by way of example, it is preferred to construct the hemispherical surface from identical detector modules, for which reason the quadrangular free surfaces of the tetrakaidecahedron or the pentagonal free surfaces of the icosahedron structure are each covered by the hexagonal base modules, as a result of which only one single module type (a hexagonal detector module) is required with both variants. To better match the hemispherical surface, it is naturally also possible to use curved detector modules.

In the case of a preferred design of the invention, the abovementioned icosahedron structure is used with which the connections between the individual detector elements and the downstream signal-processing electronics (analog amplifiers etc.) can be kept very short in order to reduce parasitic effects in this manner. The chip(s) which contain the signal-processing electronics are preferably arranged above the detector module and radiometrically screened from the detector array. The connections between the connections of the detector elements of a detector array and the connections of the chips of the signal-processing electronics are produced with the help of a flexible flat cable or a flexible connection film which is led out close to a side edge of the hexagonal detector module.

As already explained above, the preferred detector module has a hexagonal shape and contains approx. 61 connected detector elements. The external edge length of the preferred module is approximately 1.5 cm and the active surface is approximately 3 $cm^2$. The proportion of active to passive surface is approximately 50%, this proportion being dependent on the bonding technique used. In the case of so-called flip-chip contact, a proportion of active to passive surface of approximately 90% can be achieved. In the case of flip-chip contact, problems can arise due to the different coefficients of thermal expansion of AlN (conductor track carrier) and Si (detector array). A possible solution is the use of silicon also for the conductor track carrier, when a polymer layer for example can then be used as dielectric.

In the case of a preferred sphere radius of the buckyball arrangement of approx. 3.7 cm, an average solid-angle resolution of approx. 4° results. It is apparent that the solid-angle resolution can be increased, while maintaining the detector element surface density, by increasing the hemisphere radius. However, the total number of detector elements and consequently also the technical outlay required for the processing of the many data channels, also increases at the same time. The solid-angle resolution can also be increased, while maintaining the hemisphere radius, by a reduction in the active surface per detector element (and consequently by an increase in the detector element surface density), limits being set to this miniaturization by the bonding techniques used.

In the following, the invention is described with reference to the drawings in which.

Figure 1:
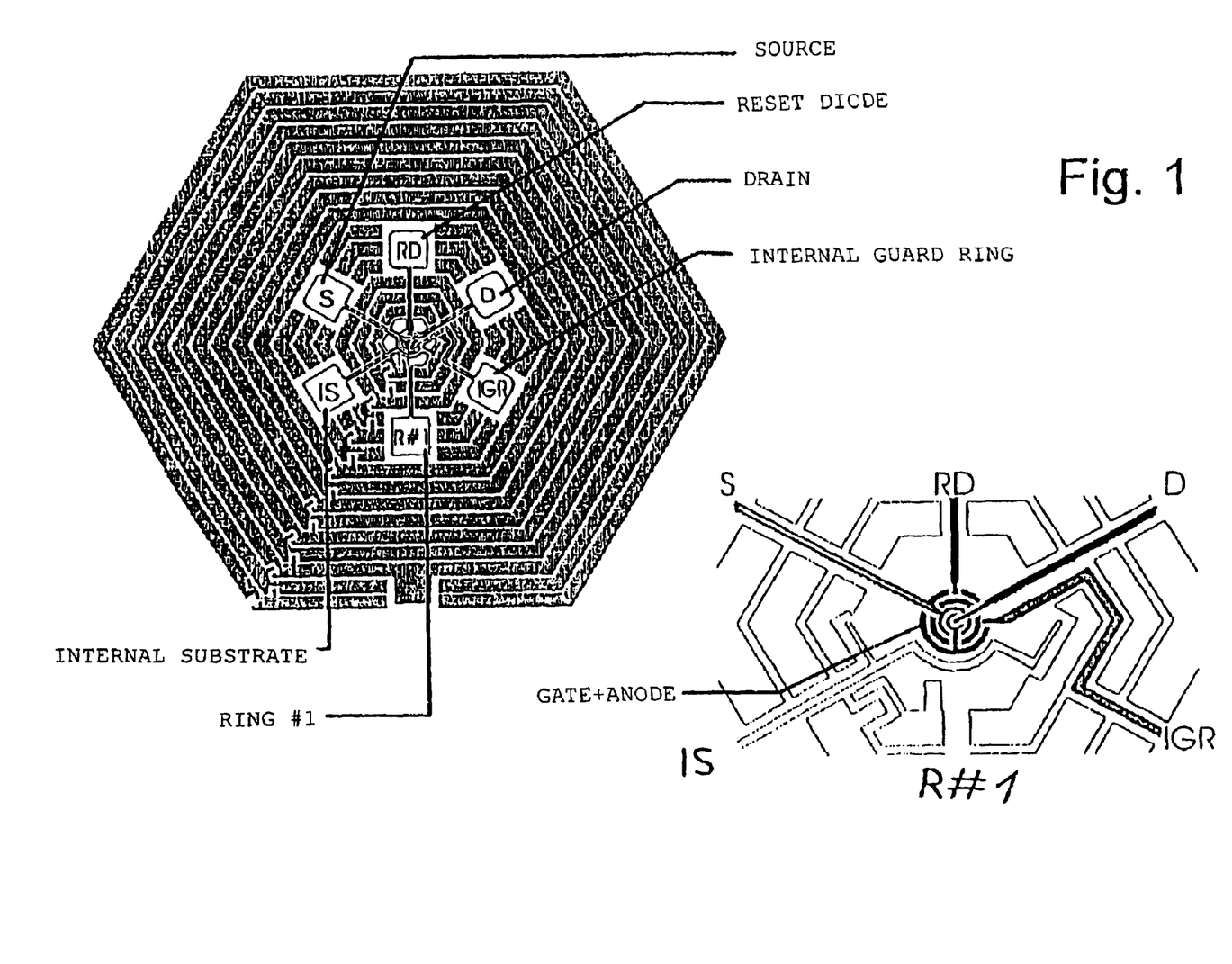
FIG. 1 shows an overall view and a detail of the metallization plane of a detector element.

The left part of FIG. 1 shows the overall view of the metallization plane of an individual detector element, and the right-hand part of FIG. 1 shows a detail of this metallization plane. In the centre of the detector element are located drain (D) and also gate and source (S) connections of the monolithically integrated field effect transistor (single-sided junction FET: SSJFET). An internal guard ring (IGR) and a substrate connection (IS) divide the transistor spatially from its surrounding. The shaded metal strips represent the electrodes of the closed p-doped troughs of the drift region that lie underneath. The strip potentials are set through a voltage-dividing resistance chain (zig-zag structure). These strip potentials rise from approximately −10 V as the radius increases. A hexagonal detector array preferably has 61 of these detector elements, these 61 detector elements being surrounded by a honeycomb-shaped metallization (see FIG. 2) by means of which the individual detector elements are supplied with the highest blocking voltage. The substrate rear side of the individual detector elements is likewise biased and forms the entry window for the photons to be detected.

Figure 2:
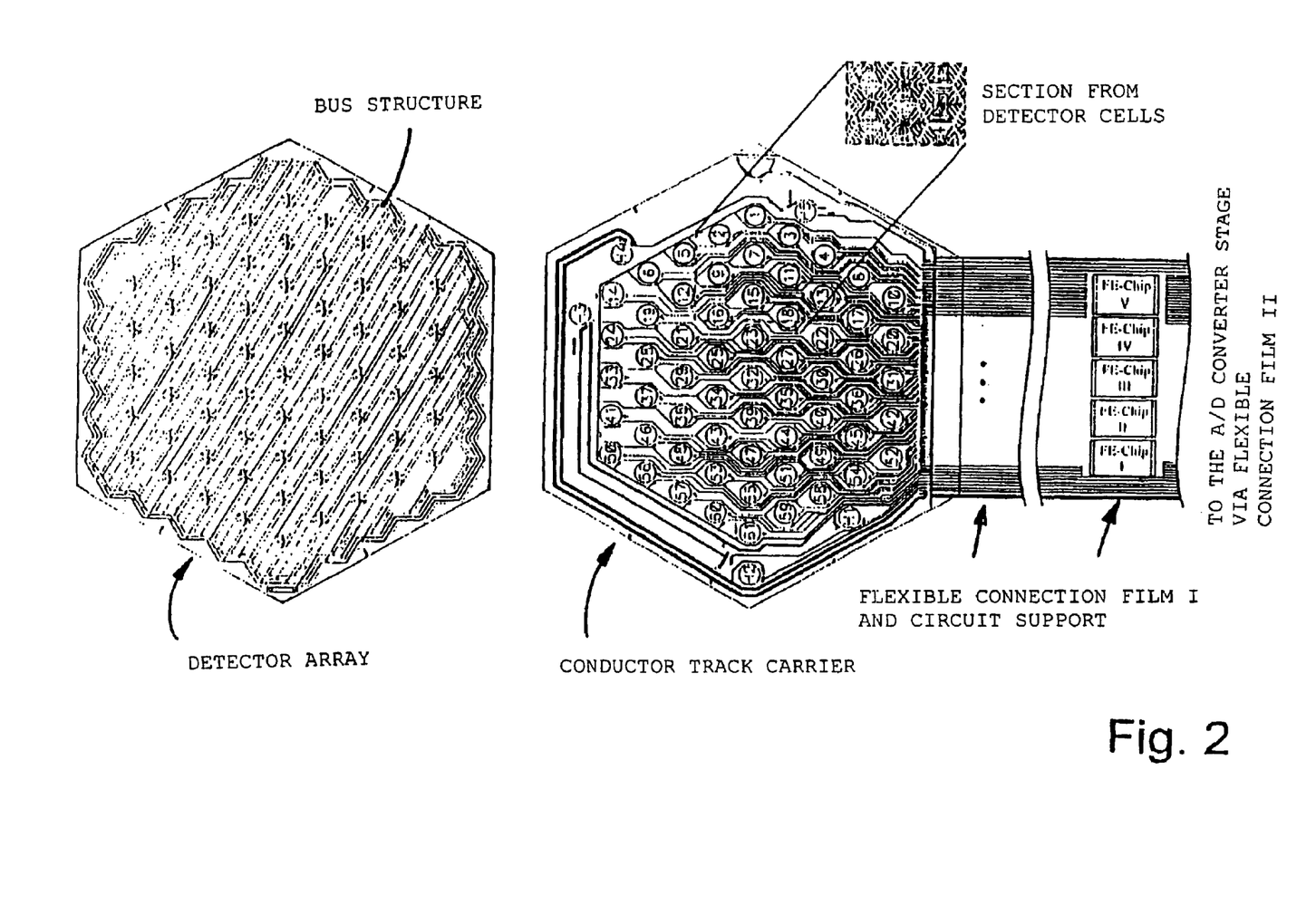
FIG. 2 shows a view of the chain-bonded detector array (left) and the conductor track carrier (middle) with an array section and also the flexible connection film with a circuit support (right)

FIG. 2 shows the structure of a detector module with 61 detector elements and the corresponding arrangement of the connections of the detector elements. In the left part of FIG. 2 is shown the arrangement of the individual detector elements to form a detector array (for the sake of clarity, only the metallization plane of the cell core with bonding surfaces is shown), in the middle part a conductor track carrier which is arranged in assembled state above the detector array, and in the right-hand part a flexible connection film with a circuit support. The congruence to be achieved is intended to be shown in FIG. 2 by the detector section from which it can be deduced that the bores in the conductor track carrier are located above the detector elements in assembled state. As shown schematically in the left-hand part of FIG. 2, four of the six respective connections (pads) of a detector element are joined using simple chain bond connections to an external bus structure running around the external edges of the detector array. The connections RD and IS (see left-hand part of FIG. 1) lie on a common potential. The bus signals and also the two remaining connections R#1 and S (see left-hand part of FIG. 1) are connected via bonding wire connections through a total of 66 bores, the diameter of which is approximately 1.25 mm, to end contact points of respective conductor tracks which are provided on the ceramic conductor track carrier (middle part of FIG. 2). The connections R#1 and S of each detector element are guided through the bore lying in each case above the detector element and connected to the associated contact points of the conductor tracks. All conductor tracks on the conductor track carrier open out at one of the six edges of the conductor track carrier (in FIG. 2, it is the right-hand edge of the conductor track carrier) and are coupled by wire connections directly or via a flexible connection film to five integrated circuits (front-end chips) which each have 12 analog channels (see right-hand part of FIG. 2), where the measurement signals are processed. In addition to the active components, some passive components can also be located on the circuit support.

Figure 3:
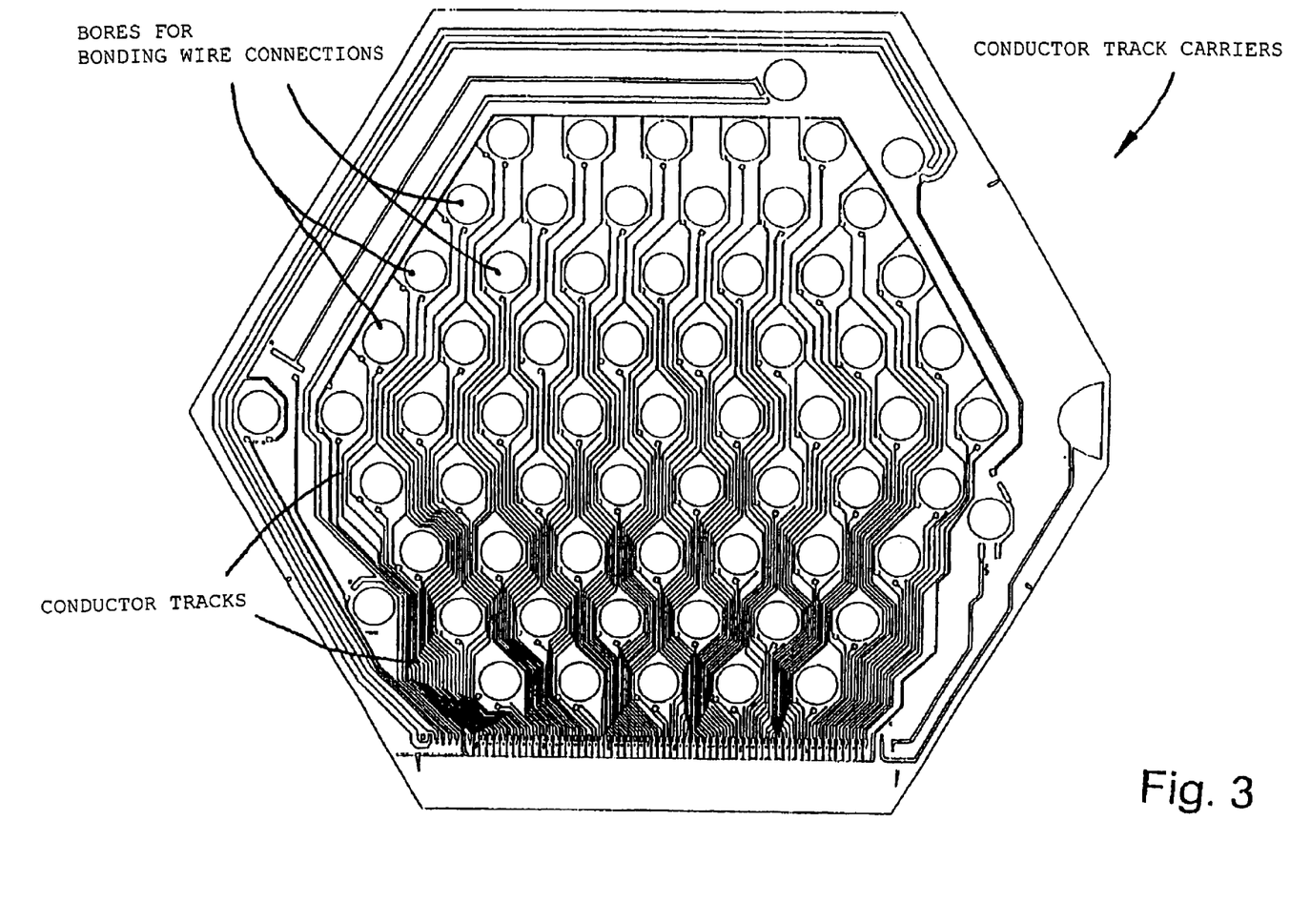
FIG. 3 shows an enlarged representation of the conductor track carrier.

FIG. 3 shows an enlarged representation of the conductor track carrier from FIG. 2 which is arranged over the detector array in assembled state of the detector module. Clearly to be seen are the bores for guiding the two bonding wires of the two detector connections of each detector element. The bores are in each case arranged in the assembled state of the detector module above an associated detector element. Provided directly at the edge of these bores, on the surface of the conductor track carrier facing away from the detector array, are in each case two end contacts (output signal connection S and supply voltage R#1) of conductor tracks to which the bonding wires starting from the detector connections and guided out through the associated bores are bound. The conductor tracks then run between the other bores in the direction of the right-hand edge of the conductor track carrier where they end in a row of second end contacts to which a flexible connection film or a rigid circuit support can then be connected.

The arrangement shown in FIG. 3 or the course of the conductor tracks from the first end contact to the second end contact is specified precisely so that the individual conductor tracks are very largely decoupled vis-à-vis conductor tracks running nearby. As can also be seen in FIG. 3, so-called screening conductor tracks, each of which lies on the fixed potential R#1, run between the individual signal-carrying conductor tracks, each of which is coupled with the output signal connections S.

Figure 4:
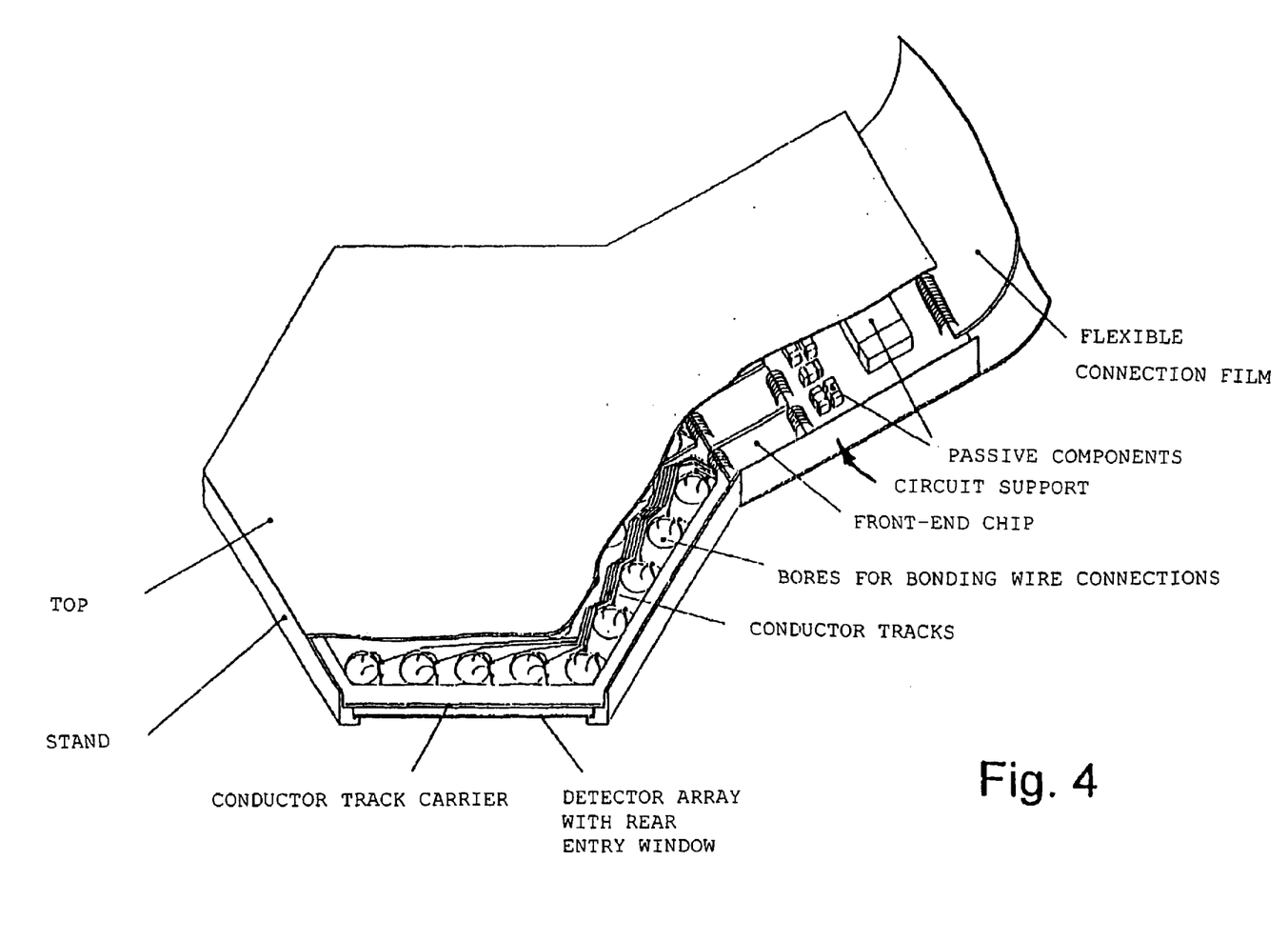
FIG. 4 shows a perspective view of a fully-assembled detector module according to the first embodiment of the invention.

FIG. 4 shows the overall mechanical structure of the detector module according to the first embodiment of the invention. Shown are the detector array, constructed from the 61 detector elements, with entry windows pointing downwards in FIG. 4, and the conductor track carrier arranged above the detector array. The detector array and the conductor track carrier are contained in a hexagonal housing. As explained with reference to FIG. 2, four of the six connections of each of the 61 detector elements of the detector array are connected to an external bus structure through simple chain bond connections. To assemble the detector module, the detector array is first inserted into the housing, glued to this and bonded in the form of a chain. The already-equipped arrangement of conductor track carrier and circuit support is secured above the detector array in the housing, the detector array and the conductor track carrier being a uniform distance from one another. The bonding wires provided for the conductor track connection are then guided through the bores and connected to the two free connections of the individual detector elements. At this point the advantages of the invention become particularly clear, as it is easily recognizable that, of the six connections, contact with only two connections through the bores of the conductor track carrier is necessary. The remaining four connections of each detector element are connected by simple chain bond connections, which is mechanically uncritical, as in the case of this production step, the upper contact surface of the detector array is exposed.

In the case of the design of the detector module shown in FIG. 4, the front-end chips and further passive components are provided on a circuit support which is connected directly to the conductor track carriers through wire connections provided the connection lines and the circuit are not jointly realized on a common support.

Figure 5:
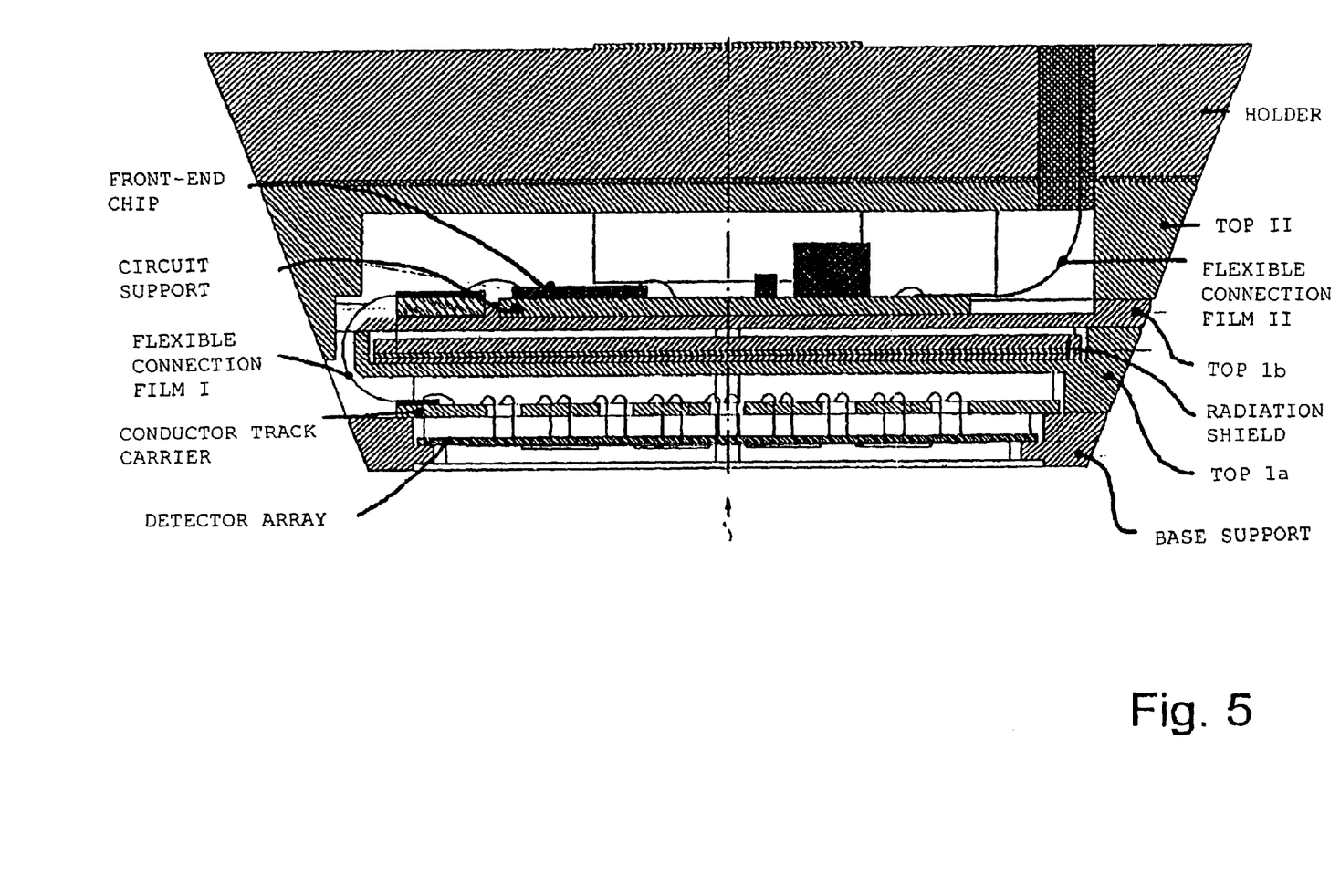
FIG. 5 shows a cross-section view of a detector module according to a second embodiment of the invention.

A much more compact construction of the detector module is shown in FIG. 5 in which a cross-section of an alternative design of the detector module is shown. As can be seen in FIG. 5, the bonded detector array with the downward-pointing radiation entry windows is inserted into a hexagonal housing (or into the base support) and glued to this. The conductor track carrier is inserted into the housing directly above the detector array (and at a uniform distance from it). In this cross-section view can be seen the bores, provided in the conductor track carrier, through which are guided the two bonding wires for each detector element by means of which the two connections of the respective detector element are connected to associated conductor tracks on the conductor track carrier. As can be seen in FIGS. 2, 3 and 4, also in the case of the design shown in FIG. 5, the conductor tracks provided on the conductor track carrier end at an edge of the conductor track carrier and are connected to a flexible connecting film I at their end points or end contacts. The opposed contacts of the connection film I are connected to a separate circuit support on which all of the analog signal-processing electronics are provided. The components provided on the circuit support are in general relatively radiation-sensitive and must therefore be screened. This is achieved in the design shown in FIG. 5 by providing, above the conductor track carrier, already secured in the housing, a radiation shield above which the circuit support provided with the signal-processing electronics is arranged. As can be seen clearly in FIG. 5, the flexible connection film I, starting from the conductor, is guided laterally through a gap past the radiation shield to the circuit support. The output signals from the circuit support are then guided through a second flexible connection film II through the top II, provided above the circuit support, of the detector module to the outside. This second connection film II serves to couple the detector module with an A/D converter module, the digital signal-processing electronics and a computer which further processes the recorded and pre-processed measurement signals. In the concrete example of holography, in the following a hologram of the atomic structure of the examined material sample is presented on a screen.

Not only for reasons of better heat dissipation does the housing of the detector module consist for the most part of graphite. The low-energy position of the carbon fluorescence also permits an extension of the sensitive energy range up to values around 300 eV. Furthermore, shaping considerations also argue for the selection of graphite, as graphite, due to its fine-grained structure, can be worked with low production tolerances of under 50 $\mu$m. Optionally, various parts of the housing, such as for example the base support or the tops Ia and Ib, can also consist of aluminium or other metals or else industrial ceramics such as aluminium oxide or aluminium nitride (AlN).

Not all photons are absorbed in the silicon volume of the detector array. Instead, the rate of transmitted photons grows with increasing photon energy. In the case of a layered module structure, as shown in FIG. 5, the signal-processing electronics can be damaged by this radiation and the module thus put out of operation. Breakdowns caused by radiation damage can be prevented by embedding of the above-mentioned radiation shield above the detector array. Photons absorbed there excite the screening materials to fluorescence radiation, which is superimposed onto the energy spectrum actually to be detected from the sample. As suitable radiation shield materials, chemically stable materials with atoms of high atomic number are suitable, such as for example tantalum or tungsten, to keep the radiation load of the electronics over the detector life-span below 1 krad. Between this first layer (for example of tantalum or tungsten) and the detector array, a second layer of a suitable material with atoms of medium atomic number, such as for example titanium, vanadium or chromium, can be provided to absorb the undesired fluorescence of the material of the first layer by absorption processes in the radiation shield, and to prevent them from entering the detector array (in the case of tantalum, tantalum fluorescence). In addition, between this second layer and the detector array, a third layer can be provided of a suitable material with atoms of low atomic number, such as for example aluminium, to again keep away the fluorescence of the material of the second layer from the detector array (in the case of titanium, titanium fluorescence). The fluorescence of this third material is also sufficiently absorbed by the carbon of the graphite of which the top is formed (see FIG. 5). In the design of the detector module represented in FIG. 5, the radiation shield consists of tantalum with a thickness of more than 300 $\mu$m, titanium with a thickness of more than 50 $\mu$m and aluminium with a thickness of more than 50 $\mu$m. Due to the large surface of the radiation shield, a thermal decoupling between radiation shield and the graphite lid lying above it is necessary. For this reason, the region represented in FIG. 5 without material between the radiation shield and the graphite lid is preferably filled with a material of low thermal conductivity, such as for example with polymers.

The version of the detector module represented in FIG. 5 is particularly suitable for the hemispherical arrangement mentioned at the outset (preferably the capped icosahedron structure of $C_{60}$ fullerene) around the examined material sample. A special frame is required for this which, for reasons of better thermal conductivity and screening from external electromagnetic fields and radiation, is made from aluminium. The holder in FIG. 5 forms the base element of this frame. In this manner, the individual detector modules can be easily and quickly replaced as required. By using identical, preferably hexagonal, detector modules, the production costs of these modules can also be kept low.

What is claimed is:

1. A detector module for radiation measurement comprising:
   a detector array having a first surface for facing a radiation source, a number of detector elements, and a second surface for facing away from the radiation source;
   a conductor track carrier spaced from the second surface of the detector array and provided with conductor tracks;
   first connections of detector elements located on the second surface of the detector array being connected to said conductor tracks by bonding wires;
   a bore in the conductor track carrier for each detector element; and
   the bonding wires of the first connections of the detector elements being guided through said bores in the conductor track carrier towards a side of the conductor track carrier facing away from the detector array, for connection to the conductor tracks formed on the surface of the conductor track carrier facing away from the detector array;
   the conductor tracks being guided to signal-processing electronics to process signals from individual detector elements.

2. A detector module according to claim 1 wherein said detector elements are integrated with amplifier electronics.

3. A detector module according to claim 1 wherein the detector elements comprise highly sensitive drift detector cells monolithically integrated with field effect transistors.

4. A detector module according to claim 1 including second connections of the detector elements connected by chain bonding connections to a bus structure on the detector array.

5. A detector module according to claim 4 wherein the bus structure is provided adjacent the external edges of the detector array and bus lines of the bus structure being connected by bonding wires to the conductor tracks on the conductor track carrier.

6. A detector module according to claim 1 wherein the detector array and the conductor track carrier are mounted in a housing.

7. A detector module according to claim 6 wherein the housing is formed of a material with high thermal conductivity and low X-ray fluorescence capacity.

8. A detector module according to claim 6 wherein the housing is formed of graphite.

9. A detector module according to claim 6 wherein the signal-processing electronics are provided in the housing.

10. A detector module according to claim 1 wherein the signal processing electronics are provided on a circuit support disposed on the side of the conductor track carrier facing away from the detector array.

11. A detector module according to claim 1 including a radiation shield for screening the signal processing electronics from the radiation source.

12. A detector module according to claim 11 wherein the radiation shield is located between the conductor track carrier and the signal processing electronics.

13. A detector module according to claim 11 wherein the radiation shield has a first layer of a chemically stable material with atoms of high atomic number.

14. A detector module according to claim 13 wherein said first layer has tantalum atoms.

15. A detector module according to claim 13 wherein said first layer has tungsten atoms.

16. A detector module according to claim 13 wherein the first layer of the radiation shield has a thickness of more than 300 μm.

17. A detector module according to claim 13 including along a side of the first layer of the radiation shield facing the radiation source, a second layer of a material with atoms of medium atomic number.

18. A detector module according to claim 17 wherein said second layer has one of titanium, vanadium and chromium atoms.

19. A detector module according to claim 17 wherein the second layer of the radiation shield has a thickness in excess of 50 μm.

20. A detector module according to claim 17 including, along a side of the second layer of the radiation shield facing the radiation source, a third layer of a material with atoms of low atomic number.

21. A detector module according to claim 20 wherein said third layer has aluminum atoms.

22. A detector module according to claim 1 wherein the conductor track carrier is coupled with a circuit support by a flexible connection film.

23. A detector module according to claim 1 in which the conductor track carrier is coupled with the signal-processing electronics by a flexible connection film.

24. A detector module according to claim 1 having one of a hexagonal, pentagonal or quadrangular shape.

25. A detector module according to claim 1 wherein contact between the detector array and the conductor track carrier includes a flip-chip contact.

26. A detector module according to claim 1 including an intermediate layer having a dielectric constant less than that of material forming the conductor track carrier, said intermediate layer being provided between mechanically stable carrier material of the conductor track carrier and a signal-carrying metallization plane of the conductor tracks.

27. A detector module according to claim 26 wherein the intermediate layer has a thickness corresponding approximately to the width of at least one of the signal-carrying conductor tracks.

28. A detector module according to claim 26 wherein said intermediate layer is formed of a material including one of benzocyclobutanes and polyphenylquinoxalines.

29. A detector module according to claim 26 including screening conductor tracks in the metallization plane between the signal-carrying conductor tracks, and further screening conductor tracks at the same point in a second metallization plane between the stable carrier material of the conductor track carrier and the dielectric intermediate layer.

30. An X-ray detector system, comprising:

a plurality of detector modules;

each detector module including: a detector array having a first surface for facing a radiation source, a number of detector elements, and a second surface for facing away from the radiation source, a conductor track carrier spaced from the second surface of the detector array and provided with conductor tracks, first connections of detector elements located on the second surface of the detector array being connected to said conductor tracks by bonding wires, a bore in the conductor track carrier for each detector element, the bonding wires of the first connections of the detector elements being guided through said bores in the conductor track carrier towards a side of the conductor track carrier facing away from the detector array, for connection to the conductor tracks formed on the surface of the conductor track carrier facing away from the detector array, and the conductor tracks being guided to signal-processing electronics to process signals from individual detector elements; and a frame for holding said detector modules on a substantially hemispherical surface about a material sample to be examined;

said substantially hemispherical surface being in the form of a capped icosahedron structure.

* * * * *